United States Patent
Xiao et al.

(10) Patent No.: US 8,242,749 B2
(45) Date of Patent: Aug. 14, 2012

(54) BATTERY TESTING APPARATUS

(75) Inventors: Ren-Jun Xiao, Shenzhen (CN);
Xiao-Lin Gan, Shenzhen (CN);
Yu-Kuang Ho, Taipei Hsien (TW)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 1263 days.

(21) Appl. No.: 11/965,754

(22) Filed: Dec. 28, 2007

(65) Prior Publication Data
US 2009/0001934 A1    Jan. 1, 2009

(30) Foreign Application Priority Data
Jun. 29, 2007    (CN) .......................... 2007 1 0200962

(51) Int. Cl.
*H02J 7/00* (2006.01)
(52) U.S. Cl. .................. 320/136; 320/133; 324/427
(58) Field of Classification Search .................. 320/131, 320/133, 136, 140, 155; 324/427, 434
See application file for complete search history.

(56) References Cited

U.S. PATENT DOCUMENTS

| | | | | |
|---|---|---|---|---|
| 5,459,671 | A | * | 10/1995 | Duley .............................. 702/63 |
| 5,680,030 | A | | 10/1997 | Kadouchi et al. |
| 6,198,253 | B1 | * | 3/2001 | Kurle et al. ..................... 320/132 |
| 2002/0060554 | A1 | * | 5/2002 | Odaohhara et al. ............ 320/134 |
| 2003/0178968 | A1 | * | 9/2003 | Sakakibara et al. ........... 320/110 |

FOREIGN PATENT DOCUMENTS
CN    1138390 A    12/1996

* cited by examiner

*Primary Examiner* — Edward Tso
*Assistant Examiner* — Aaron Piggush
(74) *Attorney, Agent, or Firm* — Altis Law Group, Inc.

(57) ABSTRACT

A battery testing apparatus includes a charge circuit, a discharge circuit, a computer, and a control circuit. The charge circuit is coupled to a direct current (DC) adapter, the DC adapter charges a battery through the charge circuit. The discharge circuit is coupled to the battery and configured to discharge the battery. The computer records charge/discharge time and charge/discharge cycles of the battery, and calculates capacity and cycle life of the battery according to the time and cycles of charge and discharge. The control circuit has an input terminal coupled to the computer, and a plurality of output terminals respectively coupled to the charge circuit and the discharge circuit, the control circuit controls the charge and discharge circuits charging and discharging the battery.

6 Claims, 1 Drawing Sheet

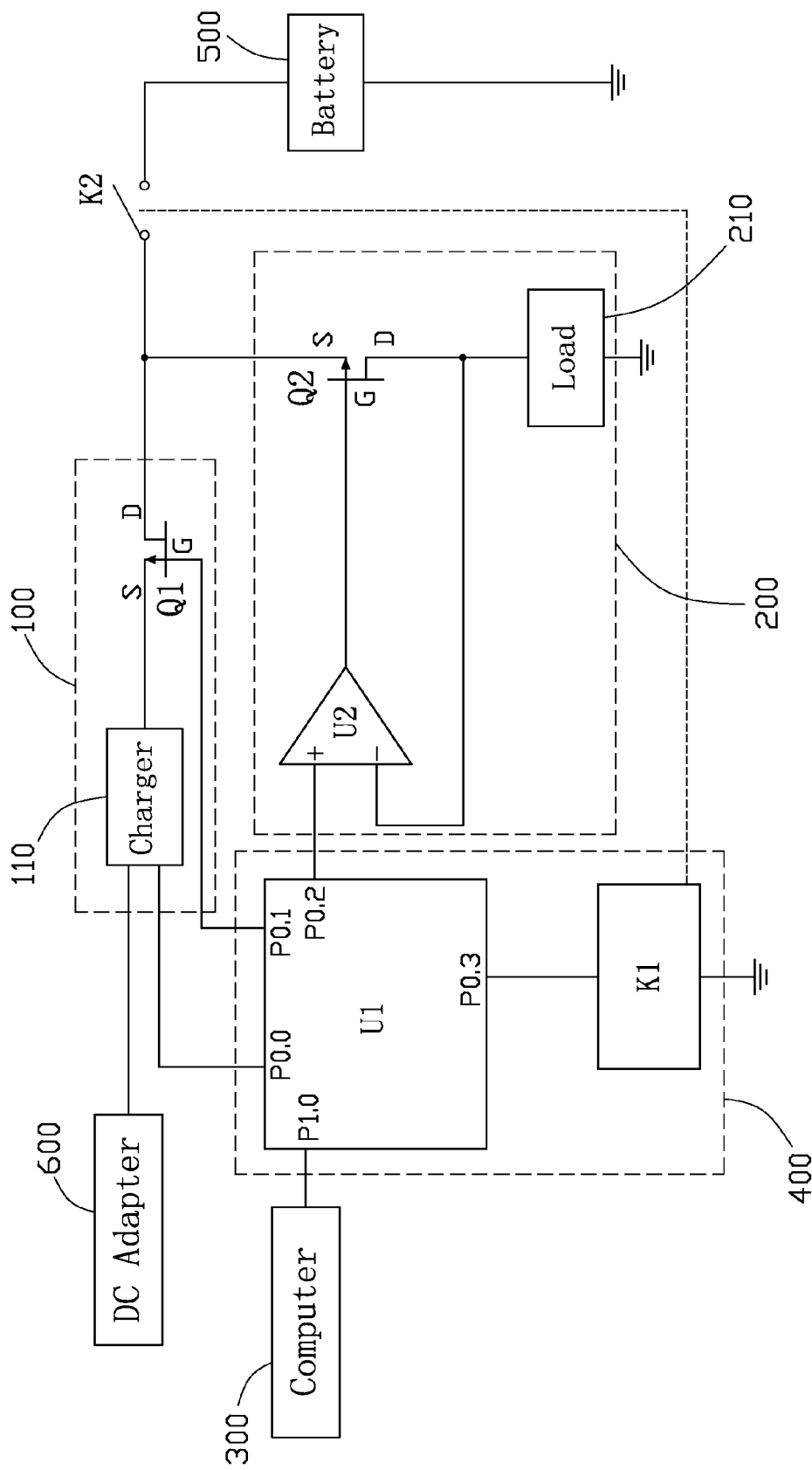

BATTERY TESTING APPARATUS

BACKGROUND

1. Field of the Invention

The present invention relates to testing apparatuses, and particularly to a battery testing apparatus for testing parameters and functions of a battery.

2. Description of Related Art

Storage batteries are often used for providing power to various pieces of equipment. Electronic equipment such as mobile phones and notebooks require high quality storage batteries. So the storage batteries need to be tested before being used in these electronic equipment. In general, testers need to test parameters and functions of the storage batteries such as cycle life, capacity, short-circuit protection (SCP), and under-voltage protection (UVP). However, conventional testing apparatuses only test a single parameter or function of a storage battery. Therefore a plurality of testing apparatuses are needed to complete testing.

What is needed, therefore, is to provide a battery single testing apparatus which can test cycle life, capacity, SCP, and UVP of a battery.

SUMMARY

An exemplary battery testing apparatus includes a charge circuit, a discharge circuit, a computer, and a control circuit. The charge circuit is coupled to a direct current (DC) adapter, the DC adapter charges a battery through the charge circuit. The discharge circuit is coupled to the battery and configured to discharge the battery. The computer records charge/discharge time and charge/discharge cycles of the battery, and calculates capacity and cycle life of the battery according to the time and cycles of charge and discharge. The control circuit has an input terminal coupled to the computer, and a plurality of output terminals respectively coupled to the charge circuit and the discharge circuit, the control circuit controls the charge and discharge circuits charging and discharging the battery.

Other advantages and novel features of the present invention will become more apparent from the following detailed description of preferred embodiment when taken in conjunction with the accompanying drawing, in which:

BRIEF DESCRIPTION OF THE DRAWING

The drawing is a circuit diagram of an embodiment of a battery testing apparatus in accordance with the present invention.

DETAILED DESCRIPTION

Referring to the drawing, a battery testing apparatus in accordance with an embodiment of the present invention includes a charge circuit 100, a discharge circuit 200, a computer 300, and a control circuit 400.

The control circuit 400 includes a single chip microcomputer (SCM) U1 and a relay. The SCM U1 is an 8051 chip, and has I/O ports P0.0~P0.3, and P1.0. The relay includes a coil K1 and a normally-open contact K2, the I/O port P0.3 is coupled to one terminal of the coil K1, and another terminal of the coil K1 is grounded. The I/O port P0.0 and P0.1 are coupled to the charge circuit 100, the I/O port P0.2 is coupled to the discharge circuit 200. The I/O port P1.0 is coupled to the computer 300. In this embodiment, the I/O ports P0.0~P0.3 act as control signal output terminals of the SCM U1, and the I/O port P1.0 acts as data input terminal of the SCM U1.

The charge circuit 100 includes a charger 110 and a P-channel MOSFET Q1. The charger 110 has an input terminal coupled to a direct current (DC) adapter 600, an output terminal coupled to the source of the MOSFET Q1, and a control terminal coupled to the I/O port P0.0 of the SCM U1. The drain of the MOSFET Q1 is coupled to the anode of a battery 500 via the normally-open contact K2 of the relay, the gate of the MOSFET Q1 is coupled to the I/O port P0.1 of the SCM U1.

The discharge circuit 200 includes an amplifier U2, a load 210, and a P-channel MOSFET Q2. The amplifier U2 has a non-inverting input terminal coupled to the I/O port P0.2 of the SCM U1, an inverting input terminal coupled to the drain of the MOSFET Q2, and an output terminal coupled to the gate of the MOSFET Q2. The drain of the MOSFET Q2 is grounded via the load 210, the source of the MOSFET Q2 is coupled to the anode of the battery 500 via the normally-open contact K2 of the relay.

In use, the SCM U1 is activated by the computer 300, then the SCM U1 outputs low level control signals to the relay, the charger 110, and the MOSFET Q1. The normally-open contact K2 of the relay is closed and the MOSFET Q1 turns on, the charger 110, the MOSFET Q1, and the battery 500 form a charge loop. The DC adapter 600 charges the battery 500 through the charger 110. When the voltage on the battery 500 rises to equal a charge cut-off voltage, the SCM U1 outputs a feedback signal to the computer 300 to indicate that charging has completed, and outputs a high level control signal to turn off the MOSFET Q1. Then the SCM U1 outputs a low level control signal to the amplifier U2, the MOSFET Q2 turns on, the load 210, the MOSFET Q2, and the battery 500 form a discharge loop. The amplifier U2 controls the discharge of current of the load 210 to be through the MOSFET Q2. When the voltage on the battery 500 falls to equal a discharge cut-off voltage, the SCM U1 outputs a feedback signal to the computer 300 to indicate the discharging has completed, and outputs a high level control signal to turn off the MOSFET Q2.

During the charging and discharging operation of the battery testing apparatus, the computer 300 records the charge/discharge time, and calculates capacity of the battery 500 by multiplying the charge time and the charge current or multiplying the discharge time and the discharge current. Charging and discharging the battery 500 again and again until the battery 500 holds eighty percent of the primary charge, the computer 300 records the number of cycles as cycle life of the battery 500. Short-circuit protection (SCP) and under-voltage protection (UVP) functions of the battery 500 are tested by respectively providing an over-current and an under-voltage to the charge circuit 100 and the discharge circuit 200. During the charging operation, when the over-current is provided to the battery 500, if the normally-open contact K2 of the relay is open, the SCP function is working. During the discharging operation, when the under-voltage is provided to the battery 500, if the normally-open contact K2 of the relay is open, the UVP function is working. On the other hand, during the charging and discharging operation, when the over-current or under-voltage is provided to the battery 500, and the normally-open contact K2 of the relay is closed, the SCP and/or UVP functions are not working.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A battery testing apparatus, comprising:
   a charge circuit coupled to a direct current (DC) adapter, the DC adapter to charge a battery through the charge circuit;
   a discharge circuit to discharge the battery;
   a computer to record charge/discharge time and charge/discharge cycles of the battery, and to calculate capacity and cycle life of the battery according to the time and cycles of charge and discharge; and
   a control circuit comprising an input terminal coupled to the computer, and a plurality of output terminals respectively coupled to the charge circuit and the discharge circuit, wherein the control circuit controls the charge and discharge circuits charging and discharging the battery;
   wherein the control circuit comprises a single chip microcomputer (SCM) and a relay, the SCM comprises an input terminal, a first output terminal, a second output terminal, a third output terminal, and a fourth output terminal, the input terminal of the SCM acting as the input terminal of the control circuit is coupled to the computer, the first and second output terminals acting as the output terminals of the control circuit are coupled to the charge circuit, the third output terminal acting as the output terminal of the control circuit is coupled to the discharge circuit, the fourth output terminal of the SCM is grounded via the relay.

2. The battery testing apparatus as claimed in claim 1, wherein the relay comprises a coil and a normally-open contact, the fourth output terminal of the SCM is grounded via the coil of the relay, the normally-open contact is coupled to the charge and discharge circuits, and the anode of the battery.

3. The battery testing apparatus as claimed in claim 2, wherein the charge circuit comprises a charger and a first switch, the charger has an input terminal coupled to the DC adapter, an output terminal coupled to an input terminal of the first switch, and a control terminal coupled to the first output terminal of the SCM, an output terminal of the first switch is coupled to the anode of the battery via the normally-open contact of the relay, a control terminal of the first switch is coupled to the second output terminal of the SCM.

4. The battery testing apparatus as claimed in claim 3, wherein the first switch is a P-channel MOSFET, the source of the MOSFET acts as the input terminal of the first switch, the drain of the MOSFET acts as the output terminal of the first switch, the gate of the MOSFET acts as the control terminal of the first switch.

5. The battery testing apparatus as claimed in claim 2, wherein the discharge circuit comprises an amplifier, a second switch, and a load, the amplifier with a non-inverting input terminal coupled to the third output terminal of the SCM, an inverting input terminal coupled to an input terminal of the second switch, and an output terminal coupled to an control terminal of the second switch, the input terminal of the second switch is also coupled to one terminal of the load, another terminal of the load is grounded, an output terminal of the second switch is coupled to the anode of the battery via the normally-open contact of the relay.

6. The battery testing apparatus as claimed in claim 5, wherein the second switch is a P-channel MOSFET, the drain of the MOSFET acts as the input terminal of the second switch, the source of the MOSFET acts as the output terminal of the second switch, the gate of the MOSFET acts as the control terminal of the second switch.

* * * * *